United States Patent [19]
Melzner

[11] Patent Number: 5,460,690
[45] Date of Patent: Oct. 24, 1995

[54] MANUFACTURING METHOD FOR A SELF-ALIGNED THROUGH HOLE AND SEMICONDUCTOR STRUCTURE

[75] Inventor: Hanno Melzner, Feldkirchen Westerham, Germany

[73] Assignee: Siemens Aktiengesellschaft, Munich, Germany

[21] Appl. No.: 373,006

[22] Filed: Jan. 17, 1995

Related U.S. Application Data

[63] Continuation of Ser. No. 122,302, Sep. 17, 1993.

[30] Foreign Application Priority Data

Sep. 29, 1992 [DE] Germany .................. 42 32 621.4

[51] Int. Cl.⁶ .................. H01L 21/306; B44C 1/22; C03C 15/00
[52] U.S. Cl. .................. 156/644.1
[58] Field of Search .................. 437/41, 52; 156/643.1, 156/647.1, 644.1, 650.1, 653.1, 657.1, 659.11, 662.1; 216/17, 39, 56

[56] References Cited

U.S. PATENT DOCUMENTS

| | | | |
|---|---|---|---|
| 5,043,781 | 8/1990 | Nishiura et al. | 437/141 X |
| 5,094,900 | 3/1992 | Langley | 428/131 |
| 5,275,972 | 1/1994 | Ogawa et al. | 437/195 |

FOREIGN PATENT DOCUMENTS 0388075  9/1990  European Pat. Off. .
3-201532A2  9/1991  Japan .

OTHER PUBLICATIONS

Research Disclosure 32246 disclosed anonymously Feb. 1991.

IBM Technical Disclosure Bulletin, vol. 31, No. 2, Jul. 1988, "Process for Making Conductice Lines of Two Different Materials Within a Level of Wiring", (1988) pp. 34–35.

IEEE Journal of Solid–State Circuits, vol. SC018, No. 3, Jun. 1983, "A 256 kbit ROM with Serial ROM Cell Structure", Roger Cuppens et al, pp. 340–344.

Symposion in VLSI Technology 1987, Japan, "A High Density 4Mbit dRAM Process Using a Fully Overlapping Bitline Contact (FoBIC) Trench Cell", by Kuesters et al, pp. 93–94.

*Primary Examiner*—William Powell
*Attorney, Agent, or Firm*—Hill, Steadman & Simpson

[57] ABSTRACT

A self-aligned through hole (5), particularly a bit line through hole to a source/drain region (2) that is self-aligned relative to the word line, is produced in neighboring word lines (3a) having a greater spacing from one another in the proximity of the source/drain region than at other locations. Narrow spacings are completely filled by surface-wide deposition of an insulating intermediate layer and subsequent, anisotropic etching, whereas insulating spacers (4") are formed in enlarged interspaces at side walls of the encapsulated word lines (3) and thereby form a self-aligned through hole.

9 Claims, 1 Drawing Sheet

MANUFACTURING METHOD FOR A SELF-ALIGNED THROUGH HOLE AND SEMICONDUCTOR STRUCTURE

This is a continuation of application Ser. No. 122,302, filed Sep. 17, 1993.

BACKGROUND OF THE INVENTION

The present invention is directed to a manufacturing method for a self-aligned through hole of an integrated semiconductor circuit having track-shaped structures arranged on a semiconductor substrate. The through hole at least partially exposes a more deeply disposed, conductive region situated between two track-shaped structures. The invention is also directed to a semiconductor structure having track-shaped structures on a semiconductor substrate and having a more deeply disposed region arranged between the track-shaped structures.

It is often necessary when manufacturing integrated circuits to produce contacts between different conductive structures, for example an upper interconnect and a more deeply disposed, conductive region. As a consequence of the increasing miniaturization of the lateral dimensions of all structures on the semiconductor substrate, such contacts are preferably manufactured in self-aligned fashion, i.e. the actual contact area is not lithographically defined but is defined by structures that already exist. In many instances, however, a photoresist mask with a correspondingly complicated process management cannot be completely eliminated even in the manufacture of a self-aligned through hole. The adjustment or alignment of this photoresist mask, however, is relatively uncritical.

An example of this is the manufacture of a self-aligned contact between a bit line and a more deeply disposed source/drain region of a transistor in a DRAM circuit. The through hole is thereby arranged between source/drain region and the word line provided with an oxide encapsulation.

As set forth in the article by Kuesters et al., Symposion in VLSI Technology 1987, Japan, pages 93–94, a self-aligned through hole can be manufactured in that an oxide/nitride/oxide triple layer is applied surface-wide after the oxide encapsulation and is in turn removed over the conductive region using a phototechnique in a plurality of etching processes, whereby the nitride layer serves as an etching stop. The through hole in the photomask is thereby larger than the actual contact area that is essentially defined by the oxide encapsulation.

One disadvantage of this so-called FOBIC process is that the necessary nitride layer produces mechanical stresses that can cause offsets in the proximity of the word lines. Further, problems can arise in the structuring of the bit line in relationship to the etched edge of the upper oxide layer. When the bit line edge lies approximately over this etched edge, erect filaments of the bit line material can result that can cause short-circuits. When, by contrast, the etched edge is not overlapped by the bit line, an unbeneficial topography is obtained. A further disadvantage is that the upper oxide layer can only be moderately doped because of the wet-etching process, as a result whereof a planarization in a later flow step is limited.

SUMMARY OF THE INVENTION

It is an object of the present invention to provide an improved realization of a self-aligned through hole.

In general terms the present invention is a manufacturing method for a self-aligned through hole of an integrated semiconductor circuit having track-shaped structures arranged on a semiconductor substrate. The through hole at least partially exposes a more deeply disposed conductive region in the semiconductor substrate situated between two track-shaped structures.

The method has the following steps of:

manufacturing track-shaped structures such that an interspace between two track-shaped structures over the conductive region has a width $D_1$ along a length $L_1$ that is greater than a width $D_0$ of an interspace between two track-shaped structures over a further region of the semiconductor substrate that is not to be contacted;

applying an intermediate layer surface-wide over the track-shaped structures and the semiconductor substrate with a layer thickness $d_4$, whereby $D_1/2 > d_4 \geq D_0/2$ and $L_1/2 \geq d_4$; and anisotropically etching the intermediate layer until the conductive region is at least partially exposed.

The present invention is also a semiconductor structure having the following elements:

a semiconductor substrate having a deeply disposed conductive region;

track-shaped structures having an exposed surface on the semiconductor substrate;

the deeply disposed conductive region arranged between track-shaped structures, an enlarged interspace between two track-shaped structures over a conductive region having a width $D_1$ that is greater than a width $D_0$ of a narrow interspace between two track-shaped structures over a further region of the semiconductor substrate that is not to be contacted;

a through hole in the enlarged interspace which at least partially exposes the conductive region;

an insulating spacer between the through hole and side walls of the track-shaped structures having the enlarged interspace; and an insulating fill between the side walls of the track-shaped structures having the narrow spacing.

The present invention is based on a specific design of the structures that define the through hole, i.e. for example, of the word lines (gate level) in the above-explained example of the bit line through hole. The distance between the structures is enlarged in the proximity of the conductive region to be contacted in comparison to the regions wherein no through hole is to be formed. Self-aligned through holes can be produced even completely without a phototechnique by matching the layer thickness of an intermediate layer to be deposited on the structures and on the semiconductor substrate to these distances and by using an anisotropic etching process for the intermediate layer. The narrow spacings thereby remain completely filled with the insulated intermediate layer, whereas spacers are formed at the side walls of the track-shaped structures in the enlarged interspaces, these spacers surrounding the self-aligned through hole.

Some of the advantages of the method of the present invention are the well-rounded side walls of the through holes and the high-grade planarization of the surface according to the present method. Compared to the prior art FOBIC method, the plurality of process steps is reduced and the nitride layer is eliminated. In a further development of the present invention the insulating spacer and the insulating fill are each composed of a double layer having a TEOS layer and a BPSG layer.

BRIEF DESCRIPTION OF THE DRAWINGS

The features of the present invention which are believed to be novel, are set forth with particularity in the appended claims. The invention, together with further objects and advantages, may best be understood by reference to the following description taken in conjunction with the accompanying drawings, in the several Figures of which like reference numerals identify like elements, and in which:

DESCRIPTION OF THE PREFERRED EMBODIMENT

Figure 1:
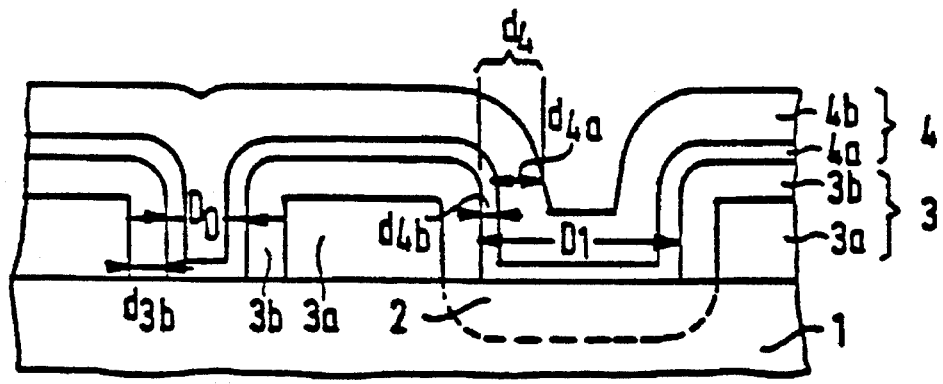
FIGS. 1 and 2 are cross-sectional views through a semiconductor substrate at which the steps of an embodiment of the method of the present invention are illustrated, whereby the section proceeds along the line I—I indicated in FIG. 3.

As depicted in FIG. 1, a source/drain region 2 is located in a semiconductor substrate as a more deeply disposed, conductive region to be contacted. Word lines 3a having an oxide encapsulation 3b at their sides and surfaces are the track-shaped structures 3 that define the through hole. The word lines 3a are insulated from the semiconductor substrate 1 by a gate oxide (not shown). Interspaces between neighboring encapsulated word lines 3 are larger (width $D_1$) over the conductive region 2 than over a part of the semiconductor substrate 1 not to be contacted (width $D_0$). The interspace everywhere outside of these widened portions $D_1$ is preferably as small as is possible in terms of process technology, i.e. it is defined here by the phototechnique for producing the word lines 3a and by the layer thickness of the oxide encapsulation 3b necessary for insulation. The widened portion extends over a length $L_1$ (see FIG. 3) in the direction of the word lines. Preferably this length approximately corresponds to the interspace $D_1$ or is somewhat shorter. The preferred value for $L_1$ is dependent, among other things, on the expanse of the source/drain region 2 in the direction of the word line.

An insulating intermediate layer 4 is now applied surface-wide. This layer 4 is a double layer composed of TEOS as lower sub-layer 4a and of BPSG as upper sub-layer 4b in this exemplary embodiment. The thickness $d_4$ of the intermediate layer 4 (measured at the side wall of the oxide encapsulation) is selected such that only the narrow interspace $d_0$ but not the widened interspace $D_1$ is completely filled up. What thus applies is $D_0/2 \leq d_4 < D_1/2$ and $d_4 \geq L_1/2$ given an approximately conformal deposition of the intermediate layer 4 and this is the layer thickness that is to be nominally deposited.

Figure 2:
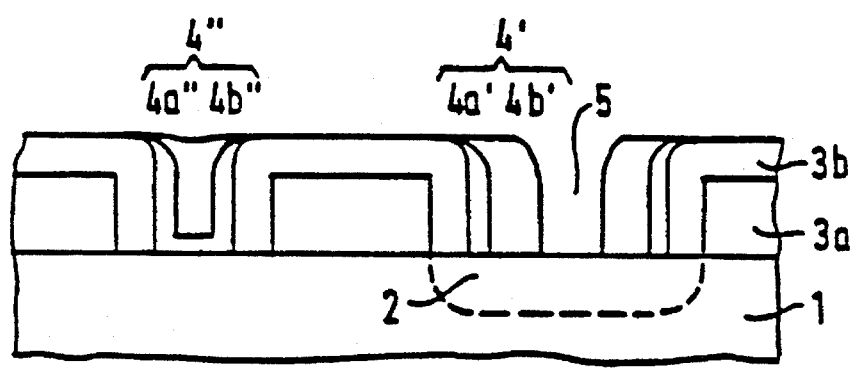

Subsequently as depicted in FIG. 2, the intermediate layer 4 is anisotropically etched back surface-wide until the conductive region 2 to be contact is at least partially uncovered. An insulating fill 4" remains in the narrow interspaces. Insulating spacers 4' are formed at the side walls of the oxide encapsulations 3b over the widened interspaces, these spacers 4' surrounding the contact area to the source/drain region 2 that has been etched free. The insulating spacers 4' thus form the side walls of the self-aligned through hole 5 that is produced. In this exemplary embodiment, they are composed of two sub-spacers 4a', 4b' lying side-by-side. In this embodiment the insulating fill 4" is also composed of two sub-spacers 4a" and 4b" lying side-by-side.

Obviously, the lateral oxide encapsulation 3b of the word line 3a can also be omitted insofar as it is not required for any other reason (for example, for producing what are referred to as LDD transistors) because the insulation between the through hole and the word line is guaranteed to the same extent by the spacers 4. In this case, a further reduction in the number of process steps results and the track-shaped structures are represented only by the word lines 3a.

The through hole 5 is obviously self-aligned relative to the word lines but not relative to a field oxide that separates from one another the source/drain regions of transistors neighboring one-another in the direction of the word line. The widened portions between the word lines must therefore be adequately well-aligned to the source/drain region in the direction of the word lines. This, however, is generally possible without difficulty since the through hole can be manufactured extremely small as a result of the surrounding spacers, for example smaller than the minimum dimension that is lithographically possible.

The dimensions and layer thicknesses d, for example, can be selected as follows:

| | | |
|---|---|---|
| $d_{3b}$ | = | 0.2 µm |
| $D_0$ | = | 0.4 µm |
| $D_1$ | = | 1.0 µm |
| $L_1$ | = | 0.6 µm |
| $d_{4a}$ | = | 100 µm |
| $d_{4b}$ | = | 250 nm. |

The dimensions of the through hole then amount to at least approximately 0.3 µm in bit line direction (i.e., perpendicular to the word lines) and 0.4 µm in word line direction.

Figure 3:
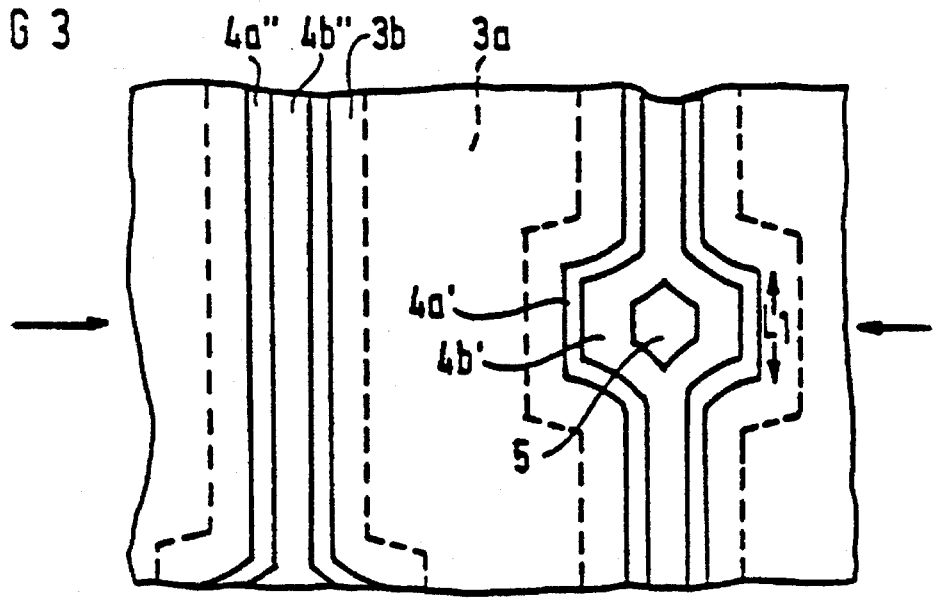
FIG. 3 a plan view of an embodiment of the semiconductor structure manufactured with the method of the present invention.

The plan view of the semiconductor substrate depicted in FIG. 3 shows the through hole 5 manufactured in self-aligned fashion surrounded by the BPSG spacer 4b' as well as the adjoining TEOS spacer 4a'. The narrow interspaces $D_0$ are completely filled with the insulating fill 4". The position of the word lines 3a under the oxide encapsulation 3b is indicted with broken lines. The shape of the contact area is essentially defined by the shape of the widened portion and, for example, can be approximately hexagonal. As a result of the filling of the gaps, the surface is now already relatively well-planarized without a specific planarization process (for example, a flow process).

In a development of the present method, it is possible to also manufacture conventional through holes, i.e. lithographically defined through holes simultaneously with the self-aligned through hole 5. For example, this can be advantageous for DRAM memories when self-aligned bit line contacts are to be produced in the cell field and conventional contacts are to be produced in the periphery. After the application of the intermediate layer 4 or, respectively, of the BPSG layer 4b, a photoresist mask is produced that is surface-wide in the cell field and is open at the locations of the through holes in the periphery. As set forth, isotropic etching is subsequently carried out, whereby the intermediate layer is etched off surface-wide in the cell field. A flowing of the BPSG can be achieved with a temperature step.

Dimensionally accurate through holes are produced in the periphery with this procedure, these being well-rounded due to the flow following the etching. Further, a good planarization can be achieved in the periphery in that a highly doped BPSG having correspondingly good flow properties is utilized. The level difference between cell field and periphery that arises in DRAM memories, for example due to the stacked capacitors that are only present in the cell field and that can make further processing more difficult, is reduced in the method of the present invention since the intermediate layer is removed surface-wide in the cell field. The periphery is thus raised by $d_4$ (plus a potential over-etching) relative to the cell field. This facilitates the structuring of following levels.

The invention is not limited to the particular details of the apparatus depicted and other modifications and applications are contemplated. Certain other changes may be made in the above described apparatus without departing from the true spirit and scope of the invention herein involved. It is intended, therefore, that the subject matter in the above depiction shall be interpreted as illustrative and not in a limiting sense.

What is claimed is:

1. A manufacturing method for a self-aligned through hole of an integrated semiconductor circuit having track-shaped structures arranged on a semiconductor substrate, the through hole at least partially exposed a surface of a conductive region in the semiconductor substrate situated between two track-shaped structures on the semiconductor surface, comprising the steps of:

manufacturing track-shaped structures such that a first interspace between two track-shaped structures over the conductive region has a width $D_1$ along a length $L_1$ that is greater than a width $D_0$ of a second interspace between two track-shaped structures over a further region of the semiconductor substrate that is not to be contacted;

applying an intermediate layer surface-wide over the track-shaped structures and the semiconductor substrate with a layer thickness $d_4$, whereby $D_1/2 > d_4 \geq D_0/2$ and $L_1/2 \geq d_4$; and anisotropically etching the intermediate layer until the conductive region is at least partially exposed.

2. The method according to claim 1, wherein the semiconductor device is a memory device, and wherein the track-shaped structures are word lines in the memory device, the track-shaped structures having an oxide encapsulation adjacent to top surfaces thereof and adjacent to sidewalls thereof and having a further insulating layer under bottom surfaces thereof, and the conductive region being a doped region arranged in the semiconductor substrate.

3. The method according to claim 1, wherein the intermediate layer is a double layer composed of a lower TEOS layer and of an upper highly doped BPSG layer.

4. The method according to claim 1, wherein said method further comprises providing a temperature step that is implemented after the step of anisotropic etching.

5. The method according to claim 1, wherein the method further comprises:

producing a photoresist mask on the intermediate layer before the anisotropic etching, said photoresist mask having a first region which does not cover the intermediate layer and in which the self-aligned through hole is produced and having a second region which essentially covers the intermediate layer and defines a further through hole; and implementing the anisotropic etching of the intermediate layer using the photoresist mask, so that the self-aligned through hole in the first region and the lithographically defined further through hole in the second region are simultaneously produced.

6. A manufacturing method for a self-aligned through hole of an integrated semiconductor circuit having track-shaped structures arranged on a semiconductor substrate, the through hole at least partially exposing a surface of a conductive region in the semiconductor substrate situated between two track-shaped structures on the semiconductor surface, comprising the steps of:

manufacturing track-shaped structures such that a first interspace between two track-shaped structures over the conductive region has a width $D_1$ along a length $L_1$ that is greater than a width $D_0$ of a second interspace between two track-shaped structures over a further region of the semiconductor substrate that is not to be contacted;

applying an intermediate layer surface-wide over the track-shaped structures and the semiconductor substrate with a layer thickness $d_4$, whereby $D_1/2 > d_4 \geq D_0/2$ and $L_1/2 \geq d_4$;

producing a photoresist mask on the intermediate layer, said photoresist mask having a first region which does not cover the intermediate layer and in which the self-aligned through hole is produced and having a second region which essentially covers the intermediate layer and defines a further through hole; and anisotropically etching the intermediate layer using the photoresist mask until the conductive region is at least partially exposed, so that the self-aligned through hole in the first region and the lithographically defined further through hole in the second region are simultaneously produced.

7. The method according to claim 6, wherein the semiconductor device is a memory device, and wherein the track-shaped structures are word lines in the memory device, the track-shaped structures having an oxide encapsulation adjacent to top surfaces thereof and adjacent to sidewalls thereof and having a further insulating Layer under bottom surfaces thereof, and the conductive region being a doped region arranged in the semiconductor substrate.

8. The method according to claim 6, wherein the intermediate layer is a double layer composed of a lower TEOS layer and of an upper highly doped BPSG layer.

9. The method according to claim 6, wherein said method further comprises providing a temperature step that is implemented after the step of anisotropic etching.

* * * * *